(12) United States Patent
Singh et al.

(10) Patent No.: US 8,926,850 B2
(45) Date of Patent: Jan. 6, 2015

(54) PLASMA PROCESSING WITH ENHANCED CHARGE NEUTRALIZATION AND PROCESS CONTROL

(71) Applicant: Varian Semiconductor Equipment Associates, Inc., Gloucester, MA (US)

(72) Inventors: Vikram Singh, North Andover, MA (US); Timothy J. Miller, Ipswich, MA (US); Bernard G. Lindsay, Danvers, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/708,412

(22) Filed: Dec. 7, 2012

(65) Prior Publication Data

US 2013/0092529 A1    Apr. 18, 2013

Related U.S. Application Data

(63) Continuation of application No. 12/105,761, filed on Apr. 18, 2008, which is a continuation-in-part of application No. 11/771,190, filed on Jun. 29, 2007, now abandoned.

(51) Int. Cl.
*C03C 15/00* (2006.01)
*C23C 14/34* (2006.01)
*H01J 37/32* (2006.01)
*H01L 21/3213* (2006.01)

(52) U.S. Cl.
CPC ......... *C23C 14/345* (2013.01); *H01J 37/32412* (2013.01); *H01J 37/321* (2013.01); *H01J 37/32165* (2013.01); *H01L 21/32136* (2013.01)
USPC ............................................. 216/67; 216/63

(58) Field of Classification Search
None
See application file for complete search history.

(56) References Cited

U.S. PATENT DOCUMENTS 5,005,066 A * 4/1991 Chen ............................. 257/315
5,289,010 A    2/1994 Shohet
(Continued)

FOREIGN PATENT DOCUMENTS

EP    1973140 A2    9/2008
JP    10-4085 A    1/1998
(Continued)

OTHER PUBLICATIONS
International Search Report mailed Aug. 29, 2008 in corresponding PCT application No. PCT/US2008/066703.
(Continued)

*Primary Examiner* — Nadine Norton
*Assistant Examiner* — Bradford Gates (57) ABSTRACT

Plasma processing with enhanced charge neutralization and process control is disclosed. In accordance with one exemplary embodiment, the plasma processing may be achieved as a method of plasma processing a substrate. The method may comprise providing the substrate proximate a plasma source; applying to the plasma source a first RF power level during a first period and a second RF power level during a second period, the first and second RF power levels being greater than zero RF power level, wherein the second RF power level is greater than the first RF power level; generating with the plasma source a first plasma during the first period and a second plasma during the second period; and applying to the substrate a first bias voltage during the first period and a second bias voltage during the second period, wherein the first voltage has more negative potential than the second voltage.

20 Claims, 7 Drawing Sheets

(56) References Cited

U.S. PATENT DOCUMENTS

| | | |
|---|---|---|
| 5,444,259 A | 8/1995 | Ohmi |
| 5,508,227 A | 4/1996 | Chan et al. |
| 5,846,883 A | 12/1998 | Moslehi |
| 6,016,131 A | 1/2000 | Sato et al. |
| 6,214,162 B1 | 4/2001 | Koshimizu |
| 6,237,527 B1 | 5/2001 | Kellerman et al. |
| 6,253,704 B1 | 7/2001 | Savas |
| 6,261,962 B1 * | 7/2001 | Bhardwaj et al. ............ 438/702 |
| 6,319,355 B1 | 11/2001 | Holland |
| 6,524,432 B1 | 2/2003 | Collins et al. |
| 6,589,437 B1 | 7/2003 | Collins |
| 7,453,059 B2 | 11/2008 | Koo et al. |
| 7,524,743 B2 | 4/2009 | Gupta et al. |
| 7,820,533 B2 | 10/2010 | Miller et al. |
| 2002/0189544 A1 | 12/2002 | Hedberg et al. |
| 2003/0175444 A1 | 9/2003 | Huang et al. |
| 2004/0124177 A1 | 7/2004 | Urban et al. |
| 2005/0006226 A1 | 1/2005 | Baldwin et al. |
| 2005/0034816 A1 | 2/2005 | Shannon et al. |
| 2005/0106873 A1 | 5/2005 | Hoffman et al. |
| 2005/0205212 A1 * | 9/2005 | Singh et al. ............ 156/345.48 |
| 2005/0241762 A1 | 11/2005 | Paterson et al. |
| 2005/0245087 A1 * | 11/2005 | Sasagawa et al. ............ 438/706 |
| 2005/0260837 A1 | 11/2005 | Walther et al. |
| 2005/0263390 A1 | 12/2005 | Gung et al. |
| 2006/0019477 A1 | 1/2006 | Hanawa et al. |
| 2006/0027451 A1 * | 2/2006 | Park et al. ................ 204/192.26 |
| 2006/0121704 A1 | 6/2006 | Walther et al. |
| 2006/0236931 A1 | 10/2006 | Singh et al. |
| 2007/0084564 A1 | 4/2007 | Gupta et al. |
| 2007/0087574 A1 | 4/2007 | Gupta et al. |
| 2007/0170867 A1 | 7/2007 | Persing et al. |
| 2007/0224840 A1 | 9/2007 | Renau et al. |
| 2007/0227231 A1 | 10/2007 | Koo et al. |
| 2007/0281489 A1 * | 12/2007 | Pandhumsoporn et al. .. 438/710 |
| 2008/0132046 A1 | 6/2008 | Walther |
| 2008/0169183 A1 | 7/2008 | Hertel et al. |
| 2008/0200015 A1 | 8/2008 | Miller et al. |
| 2009/0000946 A1 | 1/2009 | Singh et al. |
| 2009/0001890 A1 | 1/2009 | Singh et al. |
| 2009/0004836 A1 | 1/2009 | Singh et al. |
| 2009/0227096 A1 | 9/2009 | Godet et al. |
| 2009/0255800 A1 | 10/2009 | Koshimizu |
| 2011/0309049 A1 | 12/2011 | Papasouliotis et al. |

FOREIGN PATENT DOCUMENTS

| | | |
|---|---|---|
| JP | 10-150025 A | 6/1998 |
| JP | 10-312899 A | 11/1998 |
| JP | 11-224796 A | 8/1999 |
| JP | 2003-073814 A | 3/2003 |
| WO | 01/12873 A1 | 2/2001 |

OTHER PUBLICATIONS

Written Opinion of the International Searching Authority mailed Aug. 29, 2008 in corresponding PCT application No. PCT/US2008/066703.

Fundamentals of Plasma Chemistry, Chapter 1 (1974), pp. 1-3, BELL.

Plasma Immersion Ion Implantation for ULSI Devices, p. 337, University of California, Berkeley, CA, USA, Cheung, et al.

Plasma Immersion Ion Implantation As An Alternative Deep Trench Buried-Plate Doping Technology, IEEE, 2000, pp. 460-463, Lee, et al.

Vacuum Technology & Coating, Mar. 2008, High Power Pulsed Magnetron Sputtering (HPPMS), pp. 44-47, Martin.

Trench Doping Conformality by Plasma Immersion Ion Implantation (PII), IEEE, 1994, pp. 196-198, University of California, Berkeley, CA, USA, Yu, et al.

International Search Report mailed Sep. 22, 2011 in co-pending PCT application No. PCT/US2011/040206.

Written Opinion mailed Sep. 22, 2011 in co-pending PCT application No. PCT/US2011/040206.

The Journal of Chemical Physics, vol. 57, No. 2, Jul. 15, 1972, "Electronic Properties of Sulphur Hexafluoride. II. Molecular Orbital Interpretation of Its X-Ray Absorption Spectra", pp. 840-846, Gianturco, et al.

NIST data for argon, retrieved May 21, 2014 from http://physics.nist.gov/PhysRefData/Handbook/Tables/argontable.1.htm, 1 page.

Z. Phys D-Atoms, Molecules and Clusters, 1992, vol. 24, pp. 111-115, "Formation of negative ions by electron impact on $SiF_4$ and $CF_4$", IGA, et al.

* cited by examiner

PLASMA PROCESSING WITH ENHANCED CHARGE NEUTRALIZATION AND PROCESS CONTROL

PRIORITY

This application is a continuation application of and claims priority to U.S. patent application Ser. No. 12/105,761, filed on Apr. 18, 2008, and entitled "Plasma Processing with Enhanced Charge Neutralization and Process Control," which is a continuation-in-part application of and claims priority to U.S. patent application Ser. No. 11/771,190, filed Jun. 29, 2007, and entitled "Plasma Doping with Enhanced Charge Neutralization." The specifications of U.S. patent application Ser. No. 11/771,190 and U.S. patent application Ser. No. 12/105,761 are incorporated herein in entirety by reference.

RELATED APPLICATION

This application is also related to co-pending U.S. patent application Ser. No. 12/098,781, filed on Apr. 7, 2008, and entitled "APPARATUS FOR PLASMA PROCESSING A SUBSTRATE AND A METHOD THEREOF," which claims priority to U.S. patent application Ser. No. 11/771,190, filed Jun. 29, 2007, and entitled "Plasma Doping with Enhanced Charge Neutralization." The entire specification of U.S. patent application Ser. No. 12/098,781 is incorporated herein by reference.

BACKGROUND

Plasma processing has been widely used in the semiconductor and other industries for many decades. Plasma processing is used for tasks such as cleaning, etching, milling, and deposition. In many plasma processing systems, charge tends to accumulate on the substrate being processed. This charge build-up can result in the development of a relatively high potential voltage on the substrate that can cause plasma processing non-uniformities, arcing, and substrate damage. For example, charge build-up in plasma etching systems can result in non-uniform etch depths and pitting or damage to the surface of the substrate which can reduce process yield. In addition, charge build-up in deposition system can result in non-uniform deposition and damage to the deposited film layer.

More recently, plasma processing has been used for doping. Plasma doping is sometimes referred to as PLAD or plasma immersion ion implantation (PIII). Plasma doping systems have been developed to meet the doping requirements of some modern electronic and optical devices. Plasma doping is fundamentally different from conventional beam-line ion implantation systems that accelerate ions with an electric field and then filter the ions according to their mass-to-charge ratio to select the desired ions for implantation. In contrast, plasma doping systems immerse the target in a plasma containing dopant ions and bias the target with a series of negative voltage pulses. The electric field within the plasma sheath accelerates ions toward the target thereby implanting the ions into the surface of the target.

Plasma doping systems for the semiconductor industry generally require a very high degree of process control. Conventional beam-line ion implantation systems that are widely used in the semiconductor industry have excellent process control and also excellent run-to-run uniformity. Conventional beam-line ion implantation systems provide highly uniform doping across the entire surface of state-of-the-art semiconductor substrates.

In general, the process control of plasma doping systems is not as good as conventional beam-line ion implantation systems. In many plasma doping systems, charge tends to accumulate on the substrate being plasma doped. This charge build-up can result in the development of a relatively high potential voltage on the substrate that can cause unacceptable doping non-uniformities and arcing, which can result in device damage.

SUMMARY

Plasma processing with enhanced charge neutralization and process control is disclosed. In accordance with one exemplary embodiment, the plasma processing may be achieved as a method of plasma processing a substrate. The method may comprise providing the substrate proximate a plasma source; applying to the plasma source a first RE power level during a first period and a second RF power level during a second period, the first and second RF power levels being greater than zero RE power level, wherein the second RF power level is greater than the first RF power level; generating with the plasma source a first plasma during the first period and a second plasma during the second period; and applying to the substrate a first bias voltage during the first period and a second bias voltage during the second period, wherein the first voltage has more negative potential than the second voltage.

In accordance with other aspects of this particular exemplary embodiment, the method may further comprise striking the plasma to generate the first plasma during the first period.

In accordance with further aspects of this particular exemplary embodiment, the method may further comprise etching the substrate during at least one of the first and second periods.

In accordance with additional aspects of this particular exemplary embodiment, the method may further comprise depositing a material during at east one of the first and second periods.

In accordance with further aspects of this particular exemplary embodiment, at least one of the first and the second power levels may be substantially constant during respective ones of the first and the second periods.

In accordance with other aspects of this particular exemplary embodiment, the method may further comprise directing ions from in the first plasma toward the substrate during the first period; and directing electrons from the second plasma toward the substrate during the second period.

In accordance with further aspects of this particular exemplary embodiment, the plasma source may comprise at least one of a planar coil RF antenna and a helical coil RF antenna; and a RF power supply electrically coupled to at least one of the planar coil RF antenna and the helical coil RF antenna.

In accordance with additional aspects of this particular exemplary embodiment, the plasma source may comprise at least one of a planar coil RF antenna and a helical coil RF antenna; and a RF power supply electrically coupled to one of the planar coil RF antenna and the helical coil RF antenna, the other one of the planar coil RF antenna and the helical coil RF antenna being a parasitic antenna.

In accordance with other aspects of this particular exemplary embodiment, the plasma source may comprise a planar coil RF antenna and a helical coil RF antenna; and a RF power supply electrically coupled to the planar coil RF antenna and the helical coil RF antenna.

In accordance with additional aspects of this particular exemplary embodiment, the method may further comprise applying the first RF power level to the one of the planar coil RF antenna and the helical coil RF antenna of the plasma source during the first period; and applying the second RF power level to the other one of the planar coil RF antenna and the helical coil RF antenna of the plasma source during the second period.

In accordance with further aspects of this particular exemplary embodiment, the method may further comprise applying to the plasma source a third RF power level during a third period, wherein the third RF power level is less than the first RF power level; and applying to the substrate the second bias voltage during the third period.

In accordance with other aspects of this particular exemplary embodiment, the second period may immediately follow the first period.

In accordance with additional aspects of this particular exemplary embodiment, the first bias voltage may be negative bias voltage and the second bias voltage may be ground bias voltage.

In accordance with further aspects of this particular exemplary embodiment, the first bias voltage may be negative bias voltage and the second bias voltage may be positive bias voltage.

In accordance with another exemplary embodiment, the plasma processing may be achieved as a method of plasma processing a substrate. The method may comprise applying to a plasma source a first power level during a first period and generating a first plasma containing first ions; applying to the plasma source a second power level during a second period and generating a second plasma containing second ions, the second power level being greater than the first power level; directing, during the first period, the first ions from the first plasma toward the substrate and accumulating charges in the substrate; and decreasing, during the second period, the charge accumulated in the substrate.

In accordance with other aspects of this particular exemplary embodiment, the method may further comprise striking the plasma to generate the first plasma during the first period while applying to the plasma source the first power level.

In accordance with further aspects of this particular exemplary embodiment, the the method may further comprise etching the substrate during the first period.

In accordance with additional aspects of this particular exemplary embodiment, the method may further comprise depositing a material during the first period.

In accordance with further aspects of this particular exemplary embodiment, the method may further comprise implanting ions from the plasma into the substrate during the first period.

BRIEF DESCRIPTION OF THE DRAWINGS

The invention, in accordance with preferred and exemplary embodiments, together with further advantages thereof, is more particularly described in the following detailed description, taken in conjunction with the accompanying drawings. The drawings are not necessarily to scale, emphasis instead generally being placed upon illustrating principles of the invention.

DETAILED DESCRIPTION

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all retelling to the same embodiment.

It should be understood that the individual steps of the methods of the present invention may be performed in any order and/or simultaneously as long as the invention remains operable. Furthermore, it should be understood that the apparatus and methods of the present invention can include any number or all of the described embodiments as long as the invention remains operable.

The present teachings will now be described in more detail with reference to exemplary embodiments thereof as shown in the accompanying drawings. While the present teachings are described in conjunction with various embodiments and examples, it is not intended that the present teachings be limited to such embodiments. On the contrary, the present teachings encompass various alternatives, modifications and equivalents, as will be appreciated by those of skill in the art. Those of ordinary skill in the art having access to the teachings herein will recognize additional implementations, modifications, and embodiments, as well as other fields of use, which are within the scope of the present disclosure as described herein. For example, it should be understood that the methods for neutralizing charge in a plasma processing system according to the present invention can be used with any type of plasma source.

Many plasma processing systems operate in a pulsed mode of operation where a series of pulses is applied to the plasma source to generate a pulsed plasma. Also, a series of pulses can be applied to the substrate being plasma processed during the on-periods of the plasma source pulses, which biases the substrate to attract ions for implantation, etching, or deposition. In the pulsed mode of operation, charge tends to accumulate on the substrate being plasma processed during the on-period of the plasma source pulses. When the duty cycle of the plasma source pulses is relatively low (i.e. less than about 25% and sometimes less than 2% depending upon process parameters), the charge tends to be efficiently neutralized by electrons in the plasma and there are only minimal charging effects.

However, there is currently a need to perform plasma processing in a pulsed mode of operation with relatively high duty cycles (i.e. duty cycles above about 2%). Such higher duty cycles are necessary to achieve the desired throughputs and to maintain etching rates, deposition rates, and doping levels that are required for some modern devices. For example, it is desirable to perform poly gate doping and counter doping of some state-of-the art devices by plasma doping with a duty cycle greater than 2%. In addition, it is desirable to perform many plasma etching and deposition processes at duty cycles greater than 2% to increase process throughput to acceptable levels.

As the duty cycle is increased above about 2%, there is a relatively short period of time where the charge on the substrate being plasma processed can be neutralized during the pulse-off period of the plasma source. Consequently, charge accumulation or charge build up can occur on the substrate being plasma processed, which results in the development of a relatively high potential voltage on the substrate being plasma processed that can cause plasma processing non-uniformities, arcing, and substrate damage. For example, substrates containing thin gate dielectrics can be easily damaged by excess charge build up.

The present invention relates to methods and apparatus for neutralizing charge during plasma processing. The method and apparatus of the present invention allow plasma processing to be performed at higher duty cycles by reducing the probability of damage caused by charging effects. In particular, a plasma processing apparatus according to the present invention includes a RF power supply that varies the RF power applied to the plasma source to at least partially neutralize charge accumulation during plasma processing. In addition, the bias voltage to the substrate being plasma processed can be varied to at least partially neutralize charge accumulation. Furthermore, in some embodiment of the invention, the RF power pulses applied to the plasma source and the bias voltage applied to the substrate are synchronized in time and the relative timing of the RF power pulses applied to the plasma source and the bias voltage applied to the substrate being plasma processed is varied to at least partially neutralize charge accumulation on the substrate and/or to achieve certain process goals.

More specifically, in various embodiments, single or multiple RF power supplies are used to independently power the plasma source and bias the substrate being plasma processed so as to at least partially neutralize charge during plasma processing. Also, in various embodiments, the RF power applied to the plasma source and the bias voltage applied to the substrate during plasma processing are applied at relative times to at least partially neutralize charge during plasma processing.

In addition to neutralizing charge, the method and apparatus of the present invention can precisely control at least one of the power to the RF source and the bias applied to the substrate during periods where the plasma processing is terminated (i.e. pulse-off period) in order to achieve certain process goals. For example, the method and apparatus of the present invention can precisely control at least one of the power to the RF source and the bias voltage applied to the substrate during the pulse-off period in order to allow chemical reactions to occur on the surface of the substrate. Such a capability can improve throughput and provide more process control in some etching and deposition processes.

In addition, the method and apparatus of the present invention for plasma doping can precisely control at least one of the power to the RF source and the bias voltage applied to the substrate during the pulse-off period in order to improve the retained dose while plasma doping. The resulting improvement in retained dose will reduce the implant time and thus, will increase plasma doping throughput. In addition to neutralizing charge, the method and apparatus of the present invention can precisely control at least one of the power to the RF source and the bias applied to the substrate during periods where the plasma doping is terminated in order to achieve knock-on type ion implant mechanisms that achieve improved sidewall plasma doping profiles and retrograde doping profiles as describe herein.

Figure 1A:
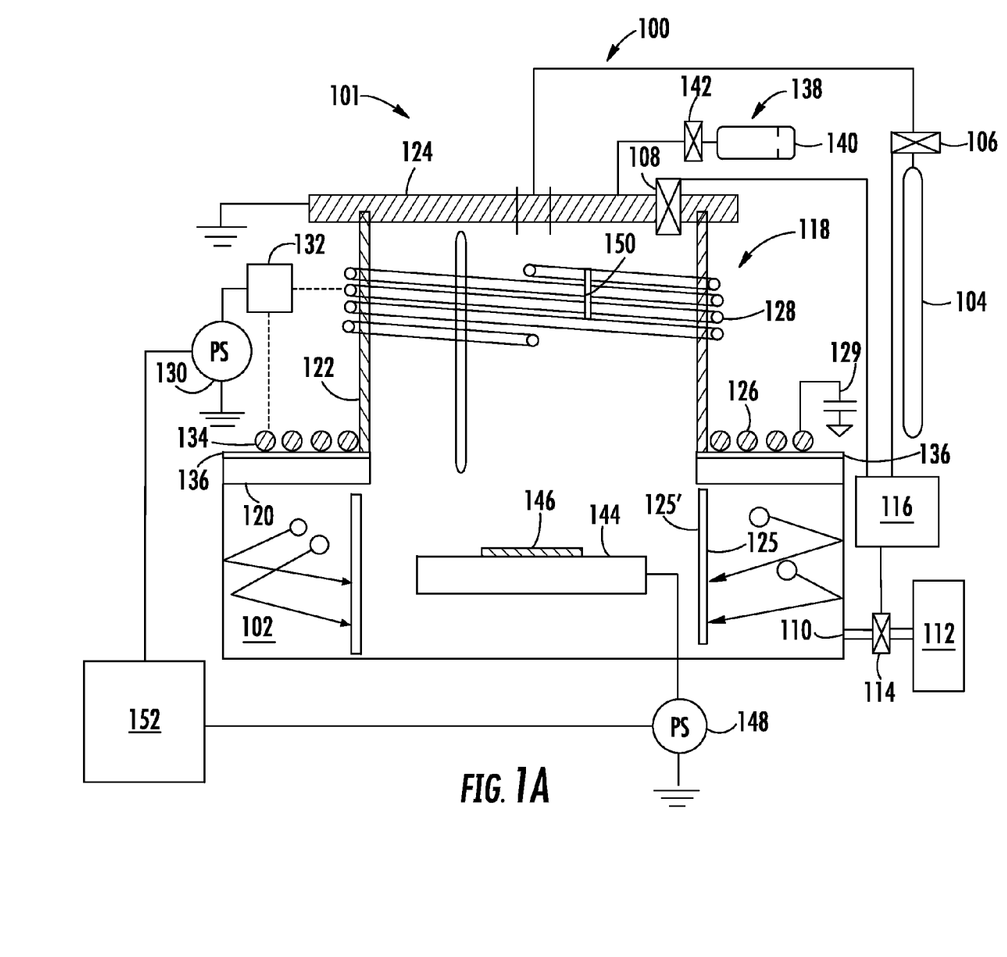
FIG. 1A illustrates one embodiment of a plasma processing system with charge neutralization according to the present invention.

FIG. 1A illustrates one embodiment of a plasma processing system 100 with charge neutralization according to the present invention. It should be understood that this is only one of many possible designs of apparatus that can perform plasma processing, such as ion implantation, deposition, and etching, with charge neutralization according to the present invention. In particular, it should be understood that there are many possible plasma sources that can be used with the plasma processing system of the present invention. The plasma source shown in FIG. 1 includes both a planar and a helical RF coil. Other embodiments include a single planar or a helical RF coil. Still other embodiments include capacitively coupled plasma sources or electron cyclotron resonance plasma sources. One skilled in the art will appreciate that there are many types of equivalent plasma sources.

The plasma processing system 100 includes an inductively coupled plasma source 101 having both a planar and a helical RF coil and a conductive top section. A similar RF inductively coupled plasma source is described in U.S. patent application Ser. No. 10/905,172, filed on Dec. 20, 2004, entitled "RF Plasma Source with Conductive Top Section," which is assigned to the present assignee. The entire specification of U.S. patent application Ser. No. 10/905,172 is incorporated herein by reference. The plasma source 101 shown in the plasma processing system 100 is well suited for plasma doping and other precise plasma processing applications that require highly uniform processing because it can provide a very uniform ion flux. In addition, the plasma source 101 is useful for high power plasma processing because it efficiently dissipates heat generated by secondary electron emissions.

More specifically, the plasma processing system 100 includes a plasma chamber 102 that contains a process gas supplied by an external gas source 104. The external gas source 104, which is coupled to the plasma chamber 102 through a proportional valve 106, supplies the process gas to the chamber 102. In some embodiments, a gas baffle is used to disperse the gas into the plasma source 101. A pressure gauge 108 measures the pressure inside the chamber 102. An exhaust port 110 in the chamber 102 is coupled to a vacuum pump 112 that evacuates the chamber 102. An exhaust valve 114 controls the exhaust conductance through the exhaust port 110.

A gas pressure controller 116 is electrically connected to the proportional valve 106, the pressure gauge 108, and the exhaust valve 114. The gas pressure controller 116 maintains the desired pressure in the plasma chamber 102 by controlling the exhaust conductance and the process gas flow rate in a feedback loop that is responsive to the pressure gauge 108. The exhaust conductance is controlled with the exhaust valve 114. The process gas flow rate is controlled with the proportional valve 106.

In some embodiments, a ratio control of trace gas species is provided to the process gas by a mass flow meter that is coupled in-line with the process gas that provides the primary dopant species. Also, in some embodiments, a separate gas injection means is used for in-situ conditioning species. Furthermore, in some embodiments, a multi-port gas injection means is used to provide gases that cause neutral chemistry effects that result in across substrate variations.

The chamber 102 has a chamber top 118 including a first section 120 formed of a dielectric material that extends in a generally horizontal direction. A second section 122 of the chamber top 118 is formed of a dielectric material that extends a height from the first section 120 in a generally vertical direction. The first and second sections 120, 122 are sometimes referred to herein generally as the dielectric window. It should be understood that there are numerous variations of the chamber top 118. For example, the first section 120 can be formed of a dielectric material that extends in a generally curved direction so that the first and second sections 120, 122 are not orthogonal as described in U.S. patent application Ser. No. 10/905,172, which is incorporated herein by reference. In other embodiments, the chamber top 118 includes only a planer surface.

The shape and dimensions of the first and the second sections 120, 122 can be selected to achieve a certain performance. For example, one skilled in the art will understand that the dimensions of the first and the second sections 120, 122 of the chamber top 118 can be chosen to improve the uniformity of plasmas. In one embodiment, a ratio of the height of the second section 122 in the vertical direction to the length across the second section 122 in the horizontal direction is adjusted to achieve a more uniform plasma. For example, in one particular embodiment, the ratio of the height of the second section 122 in the vertical direction to the length across the second section 122 in the horizontal direction is in the range of 1.5 to 5.5.

The dielectric materials in the first and second sections 120, 122 provide a medium for transferring the RF power from the RF antenna to a plasma inside the chamber 102. In one embodiment, the dielectric material used to form the first and second sections 120, 122 is a high purity ceramic material that is chemically resistant to the process gases and that has good thermal properties. For example, in some embodiments, the dielectric material is 99.6% $Al_2O_3$ or AlN. In other embodiments, the dielectric material is Yittria and YAG.

A lid 124 of the chamber top 118 is formed of a conductive material that extends a length across the second section 122 in the horizontal direction. In many embodiments, the conductivity of the material used to form the lid 124 is high enough to dissipate the heat load and to minimize charging effects that results from secondary electron emission. Typically, the conductive material used to form the lid 124 is chemically resistant to the process gases. In some embodiments, the conductive material is aluminum or silicon.

The lid 124 can be coupled to the second section 122 with a halogen-resistant O-ring made of fluoro-carbon polymer, such as an O-ring formed of Chemrz and/or Kalrex materials. The lid 124 is typically mounted to the second section 122 in a manner that minimizes compression on the second section 122, but that provides enough compression to seal the lid 124 to the second section. In some operating modes, the lid 124 is RF and DC grounded as shown in FIG. 1.

In some embodiments, the chamber 102 includes a liner 125 that is positioned to prevent or greatly reduce metal contamination by providing line-of-site shielding of the inside of the plasma chamber 102 from metal sputtered by ions in the plasma striking the inside metal walls of the plasma chamber 102. Such liners are described in U.S. patent application Ser. No. 11/623,739, filed Jan. 16, 2007, entitled "Plasma Source with Liner for Reducing Metal Contamination," which is assigned to the present assignee. The entire specification of U.S. patent application Ser. No. 11/623,739 is incorporated herein by reference.

In various embodiments, the liner is a one-piece or unitary plasma chamber liner, or a segmented plasma chamber liner. In many embodiments, the plasma chamber liner 125 is formed of a metal base material, such as aluminum. In these embodiments, at least the inner surface 125' of the plasma chamber liner 125 includes a hard coating material that prevents sputtering of the plasma chamber liner base material.

Some plasma processes, such as plasma doping processes, generate a considerable amount of non-uniformly distributed heat on the inner surfaces of the plasma source 101 because of secondary electron emissions. In some embodiments, the plasma chamber liner 125 is a temperature controlled plasma chamber liner 125. In addition, in some embodiments, the lid 124 comprises a cooling system that regulates the temperature of the lid 124 and surrounding area in order to dissipate the heat load generated during processing. The cooling system can be a fluid cooling system that includes cooling passages in the lid 124 that circulate a liquid coolant from a coolant source.

A RF antenna is positioned proximate to at least one of the first section 120 and the second section 122 of the chamber top 118. The plasma source 101 in FIG. 1 illustrates two separate RF antennas that are electrically isolated from one another. However, in other embodiments, the two separate RF antennas are electrically connected. In the embodiment shown in FIG. 1, a planar coil RF antenna 126 (sometimes called a planar antenna or a horizontal antenna) having a plurality of turns is positioned adjacent to the first section 120 of the chamber top 118. In addition, a helical coil RF antenna 128 (sometimes called a helical antenna or a vertical antenna) having a plurality of turns surrounds the second section 122 of the chamber top 118.

In some embodiments, at least one of the planar coil RF antenna 126 and the helical coil RF antenna 128 is terminated with a capacitor 129 that reduces the effective antenna coil voltage. The term "effective antenna coil voltage" is defined herein to mean the voltage drop across the RF antennas 126, 128. In other words, the effective coil voltage is the voltage "seen by the ions" or equivalently the voltage experienced by the ions in the plasma.

Also, in some embodiments, at least one of the planar coil RF antenna 126 and the helical coil RF antenna 128 includes a dielectric layer 134 that has a relatively low dielectric constant compared to the dielectric constant of the $Al_2O_3$ dielectric window material. The relatively low dielectric constant dielectric layer 134 effectively forms a capacitive voltage divider that also reduces the effective antenna coil voltage. In addition, in some embodiments, at least one of the planar coil RF antenna 126 and the helical coil RF antenna 128 includes a Faraday shield 136 that also reduces the effective antenna coil voltage.

A RF source 130, such as a RF power supply, is electrically connected to at least one of the planar coil RF antenna 126 and helical coil RF antenna 128. In many embodiments, the RF source 130 is coupled to the RF antennas 126, 128 by an impedance matching network 132 that matches the output impedance of the RF source 130 to the impedance of the RF antennas 126, 128 in order to maximize the power transferred from the RF source 130 to the RF antennas 126, 128. Dashed lines from the output of the impedance matching network 132 to the planar coil RF antenna 126 and the helical coil RF antenna 128 are shown to indicate that electrical connections can be made from the output of the impedance matching network 132 to either or both of the planar coil RF antenna 126 and the helical coil RF antenna 128.

In some embodiments, at least one of the planar coil RF antenna 126 and the helical coil RF antenna 128 is formed such that it can be liquid cooled. Cooling at least one of the planar coil RF antenna 126 and the helical coil RF antenna 128 will reduce temperature gradients caused by the RF power propagating in the RF antennas 126, 128.

In some embodiments, the plasma source 101 includes a plasma igniter 138. Numerous types of plasma igniters can be used with the plasma source 101. In one embodiment, the plasma igniter 138 includes a reservoir 140 of strike gas, which is a highly-ionizable gas, such as argon (Ar), which assists in igniting the plasma. The reservoir 140 is coupled to the plasma chamber 102 with a high conductance gas connection. A burst valve 142 isolates the reservoir 140 from the process chamber 102. In another embodiment, a strike gas source is plumbed directly to the burst valve 142 using a low conductance gas connection. In some embodiments, a portion of the reservoir 140 is separated by a limited conductance orifice or metering valve that provides a steady flow rate of strike gas after the initial high-flow-rate burst.

A platen 144 is positioned in the process chamber 102 a height below the top section 118 of the plasma source 101. The platen 144 holds a substrate 146 for plasma processing. In many embodiments, the substrate 146 is electrically connected to the platen 144. In the embodiment shown in FIG. 1, the platen 144 is parallel to the plasma source 101. However, in one embodiment of the present invention, the platen 144 is tilted with respect to the plasma source 101 to achieve various process goals.

A platen 144 is used to support a substrate 146 or other workpieces for processing. In some embodiments, the platen 144 is mechanically coupled to a movable stage that translates, scans, or oscillates the substrate 146 in at least one direction. In one embodiment, the movable stage is a dither generator or an oscillator that dithers or oscillates the substrate 146. The translation, dithering, and/or oscillation motions can reduce or eliminate shadowing effects and can improve the uniformity of the ion beam flux impacting the surface of the substrate 146.

A bias voltage power supply 148 is electrically connected to the platen 144. The bias voltage power supply 148 is used to bias the platen 144 and the substrate 146 so that ions in the plasma are extracted from the plasma and impact the substrate 146. In various embodiments, the ions can be dopant ions for plasma doping or inert or reactive ions for etching and deposition. In various embodiments, the bias voltage power supply 148 is a DC power supply, a pulsed power supply, or a RE power supply. In one embodiment of the plasma processing apparatus according to the present invention, the bias voltage power supply 148 has an output waveform that is independent of the output waveform of the RF source 130 that powers at least one of the planar coil RF antenna 126 and helical coil RF antenna 128. In another embodiment of the plasma processing apparatus according to the present invention, the bias voltage power supply 148 has an output waveform that is synchronized to the output waveform of the RF source 130 that powers at least one of the planar coil RF antenna 126 and helical coil RF antenna 128. The bias voltage power supply 148 and the RF source 130 can physically be the same power supply with two different outputs or can be separate power supplies.

A controller 152 is used to control the RF power supply 130 and the bias voltage power supply 148 to generate a plasma and to bias the substrate 146 so as to at least partially neutralize charge accumulation during plasma processing according to the present invention. The controller 152 can be part of the power supplies 130, 148 or can be a separate controller that is electrically connected to control inputs of the power supplies 130, 148. The controller 152 controls the RF power supply 130 so that pulses are applied to either or both of the planar coil RF antenna 126 and the helical coil RF antenna 128 with at least two different amplitudes. Also, the controller 152 controls the RF power supply 130 and the bias voltage power supply 148 so that the pulses are applied to at least one of the planar coil RF antenna 126 and the helical coil RF antenna 128, and also to the substrate 146 at relative times that at least partially neutralize charge accumulation during plasma processing according to the present invention.

One skilled in the art will appreciate that there are many different possible variations of the plasma source 101 that can be used with the features of the present invention. See, for example, the descriptions of the plasma sources in U.S. patent application Ser. No. 10/908,009, filed Apr. 25, 2005, entitled "Tilted Plasma Doping." Also see the descriptions of the plasma sources in U.S. patent application Ser. No. 11/163,303, filed Oct. 13, 2005, entitled "Conformal Doping Apparatus and Method." Also see the descriptions of the plasma sources in U.S. patent application Ser. No. 11/163,307, filed Oct. 13, 2005, entitled "Conformal Doping Apparatus and Method." In addition, see the descriptions of the plasma sources in U.S. patent application Ser. No. 11/566,418, filed Dec. 4, 2006, entitled "Plasma Doping with Electronically Controllable implant Angle." The entire specification of U.S. patent application Ser. Nos. 10/908,009, 11/163,303, 11/163,307 and 11/566,418 are herein incorporated by reference.

In operation, the controller 152 instructs the RF source 130 to generate RF currents that propagate in at least one of the RF antennas 126 and 128. That is, at least one of the planar coil RF antenna 126 and the helical coil RF antenna 128 is an active antenna. The term "active antenna" is herein defined as an antenna that is driven directly by a power supply. In many embodiments of the plasma processing apparatus of the present invention, the RF source 130 operates in a pulsed mode. However, the RF source 130 can also operate in the continuous mode.

In some embodiments, one of the planar coil antenna 126 and the helical coil antenna 128 is a parasitic antenna. The term "parasitic antenna" is defined herein to mean an antenna that is in electromagnetic communication with an active antenna, but that is not directly connected to a power supply. In other words, a parasitic antenna is not directly excited by a power supply, but rather is excited by an active antenna in close proximity, which in the apparatus shown in FIG. 1A is one of the planar coil antenna 126 and the helical coil antenna 128 powered by the RF source 130. In some embodiments of the invention, one end of the parasitic antenna is electrically connected to ground potential in order to provide antenna tuning capabilities. In this embodiment, the parasitic antenna includes a coil adjuster 150 that is used to change the effective number of turns in the parasitic antenna coil. Numerous different types of coil adjusters, such as a metal short, can be used.

The RF currents in the RF antennas 126, 128 then induce RF currents into the chamber 102. The RF currents in the chamber 102 excite and ionize the process gas so as to generate a plasma in the chamber 102. The plasma chamber liner 125 shields metal sputtered by ions in the plasma from reaching the substrate 146.

The controller 152 also instructs the bias voltage power supply 148 to bias the substrate 146 with negative voltage pulses that attract ions in the plasma towards the substrate 146. During the negative voltage pulses, the electric field within the plasma sheath accelerates ions toward the substrate 146 for plasma processing. For example, the electric field within the plasma sheath can accelerate ions toward the substrate 146 to implant the ions into the surface of the substrate 146, to etch the surface of the substrate 146, to produce a chemical reaction on the surface of the substrate 146 for either etching or deposition, or to grow a thin film on the surface of the substrate 146. In some embodiments, a grid is used to extract ions in the plasma towards the substrate 146 in order to increase the energy of the ions.

When the RF source 130 and the bias voltage power supply 148 are operated in the pulse mode under some processing conditions, such as with relatively high duty cycles, charge can accumulate on the substrate 146. Charge accumulation on the substrate 146 can result in the development of a relatively high potential voltage on the substrate 146 being plasma processed that can cause processing non-uniformities, arcing, and device damage. Charge accumulation on the substrate can be greatly reduced by generating multi-level RF waveforms with the RE source 130 and biasing the substrate 146 according to the present invention. In addition, certain process goals, such as process rates and process profiles, can be achieved by generating multi-level RF waveforms with the RF source 130 and biasing the substrate 146 according to the present invention.

Figure 1B:
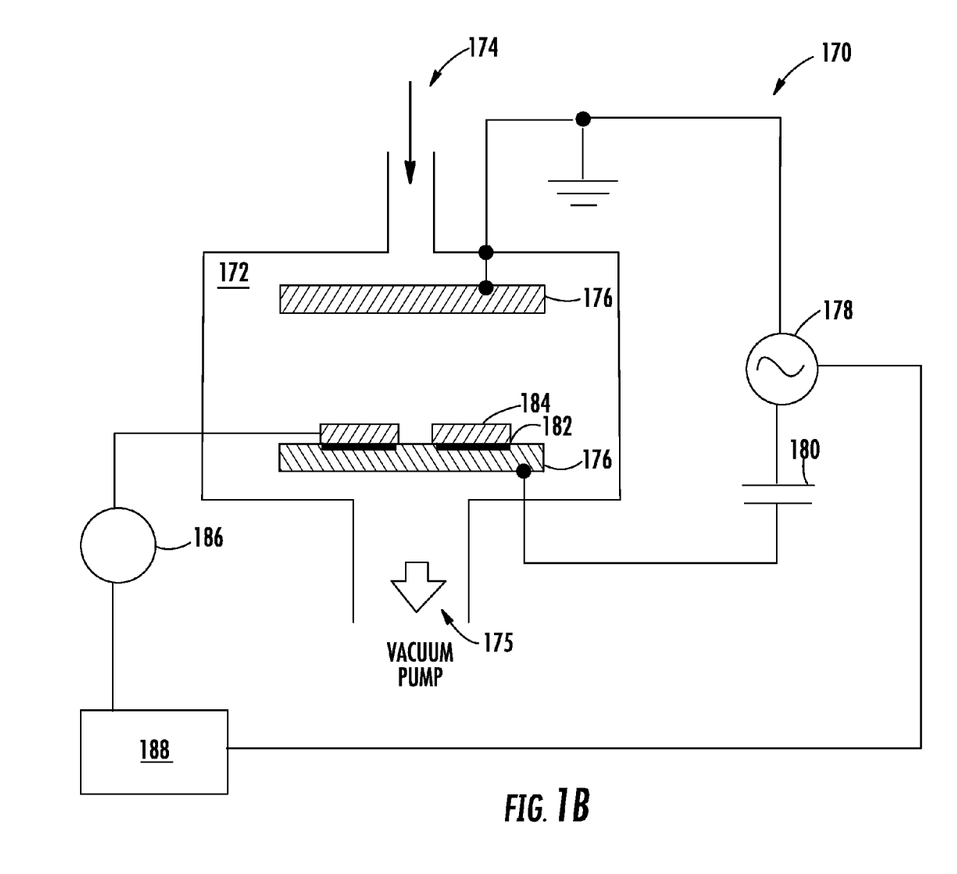
FIG. 1B illustrates another embodiment of a plasma processing system with charge neutralization according to the present invention.

FIG. 1B illustrates another embodiment of a plasma processing system 170 with charge neutralization according to the present invention. The plasma processing system 170 is a capacitive RF discharge system. Capacitive RF discharge plasma processing systems are well known in the industry. The plasma processing system 170 includes a process chamber 172 having a process gas inlet 174 that receives a feed gas from a mass flow controller which flow through the plasma discharge area. The process chamber 172 also includes an exhaust port 175 that is coupled to a vacuum pump that removes effluent gases. Typically a throttle valve is positioned in the exhaust port 175 that is coupled to a vacuum pump to control the pressure in the chamber 172. Typically operating pressures are in the 10-1000 mT range.

The plasma processing system 170 includes two planar electrodes, which are often called parallel plate electrodes 176. The parallel plate electrodes 176 are driven by an RF source 178. The parallel plate electrodes 176 are separated by a gap that is in the range of 2-10 cm. A blocking capacitor 180 is electrically connected between the output of the RF source 178 and the parallel plate electrode 176. The blocking capacitor 180 is used to remove DC and low frequency signals from the drive signal. The RF drive signal is typically in the 100-1000V range. The parallel plate electrodes 176 are typically driven by 13.56 MHz signal, but other frequencies are also suitable.

In conventional capacitive RF discharge plasma processing systems, the substrate is positioned directly on the bottom parallel plate. However, the plasma processing system 170 includes an insulator 182 that is positioned between the bottom plate and the substrate 184. The insulator 182 allows the substrate 184 to be biased independently of the parallel plate electrodes 176 which are driven by the RF source 178. A separate substrate bias voltage power supply 186 is used to bias the substrate 184. An output of the substrate bias voltage power supply 186 is electrically connected to the substrate 184 that is positioned in the insulator 182.

A controller 188 is used to control the RF power supply 186 and the bias voltage power supply 186 to generate a plasma and to bias the substrate 184 so as to at least partially neutralize charge accumulation during plasma processing according to the present invention. The controller 188 can be part of the power supplies 178, 186 or can be a separate controller that is electrically connected to control inputs of the power supplies 178, 186. The controller 188 controls the RF power supply 178 so that multi-level RF pulses are applied to the parallel plate electrode 176 with at least two different amplitudes. Also, the controller 188 controls the RF power supply 178 and the bias voltage power supply 186 so that the RF pulses are applied to the parallel plate electrodes 176 at relative times that at least partially neutralize charge accumulation during plasma processing according to the present invention.

The operation of the plasma processing system 170 is similar to the operation of the plasma processing system 100. The controller 188 instructs the RF source 178 to generate RF currents that propagate to the parallel plate electrodes 176 to generate a plasma between the parallel plates from the feed gas. The controller 188 also instructs the bias voltage power supply 186 to bias the substrate 184 with negative voltage pulses that attract ions in the plasma towards the substrate 184. During the negative voltage pulses, the electric field within the plasma sheath accelerates ions toward the substrate 184 for plasma processing. For example, the electric field within the plasma sheath can accelerate ions toward the substrate 184 to implant the ions into the surface of the substrate 184, to etch the surface of the substrate 184, to produce a chemical reaction on the surface of the substrate 184 for either etching or deposition, or to grow a thin film on the surface of the substrate 184.

When the RF source 178 and the bias voltage power supply 186 are operated under some processing conditions, charge can accumulate on the substrate 184. Charge accumulation on the substrate 184 can result in the development of a relatively high potential voltage on the substrate 184 being plasma processed that can cause processing non-uniformities, arcing, and device damage. Charge accumulation on the substrate 184 can be greatly reduced by generating multi-level RF waveforms with the RF source 178 and biasing the substrate 184 according to the present invention. In addition, certain process goals, such as process rates and process profiles, can be achieved by generating multi-level RF waveforms with the RF source 178 and biasing the substrate 184 according to the present invention.

The methods and apparatus of the present invention can be applied to numerous other types of plasma processing systems. For example, the methods and apparatus of the present invention can be applied to ECR plasma processing systems, helicon plasma processing systems, and helicon resonator plasma processing systems. In each of these systems, the RF source generates a multi-amplitude pulsed RF waveform that has at least two RF power levels. Also, in many embodiments, the substrate is biased by a bias voltage power supply that generates a bias voltage waveform that can be synchronized to the RF waveform driving the plasma source with a controller.

Figure 2A:
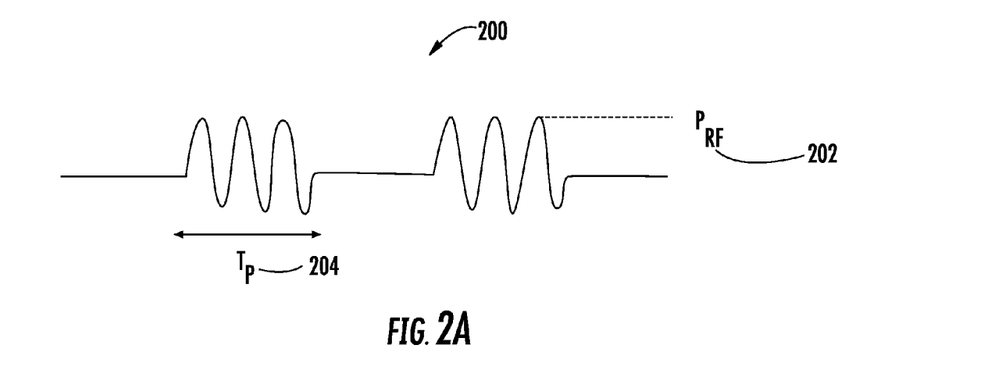
FIG. 2A illustrates a prior art waveform generated by the RF source having a single amplitude that can cause charge accumulation on the substrate under some conditions.

FIG. 2A illustrates a prior art waveform 200 generated by the RF source 130 having a single amplitude that can cause charge accumulation on the substrate 146 (FIG. 1) under some conditions. The waveform 200 is at ground potential until the plasma is generated with a pulse having a power level $P_{RF}$ 202. The power level $P_{RF}$ 202 is chosen to be suitable for plasma doping and many plasma etching and plasma deposition processes. The pulse terminates after the pulse period $T_P$ 204 and then returns to ground potential. The waveform then periodically repeats.

Figure 2B:
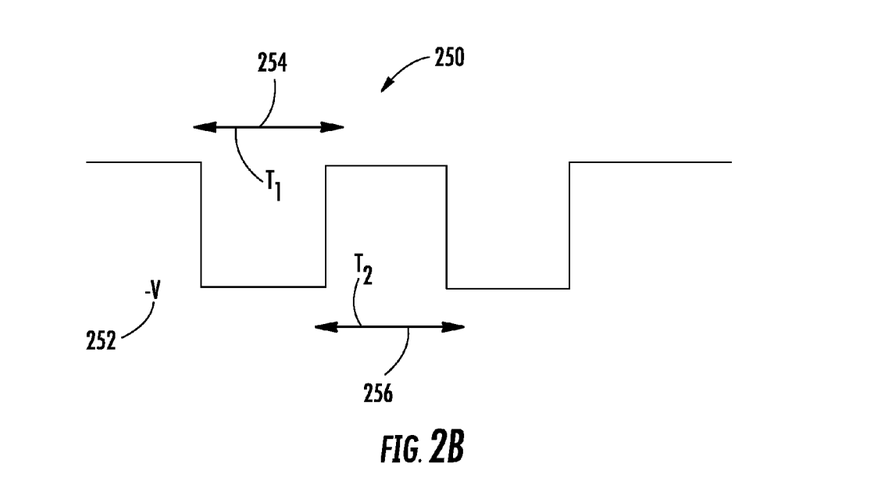
FIG. 2B illustrates a prior art waveform generated by the bias voltage supply that applies a negative voltage to the substrate during plasma processing to attract ions in the plasma.

FIG. 2B illustrates a prior art waveform 250 generated by the bias voltage supply 148 that applies a negative voltage 252 to the substrate 146 (FIG. 1) during plasma processing to attract ions in the plasma. The negative voltage 252 is applied during the period $T_1$ 254 when the waveform 200 generated by the RF source 130 has a power equal to the power level $P_{RF}$ 202. The negative voltage 252 attracts ions in the plasma to the substrate 146 for plasma processing. The waveform 200 is at ground potential during the period $T_2$ 256 when the plasma processing is terminated. At relatively high duty cycles (i.e. greater than about 25% and in some cases greater than about 2%), charge tends to accumulate on the substrate 146 during the pulse period $T_1$ 254 when the waveform 250 generated by the RF source 130 has a power equal to the power level $P_{RF}$ 202.

The methods and apparatus of the present invention allow plasma processing, such as plasma doping, plasma etching, and plasma deposition, to be performed at higher duty cycles by reducing the probability of damage caused by charging effects. There are numerous methods according to the present invention to power the plasma source 101 and to bias the substrate 146 being processed to at least partially neutralize charge accumulation on the substrate 146.

Figures 3A, 3B:
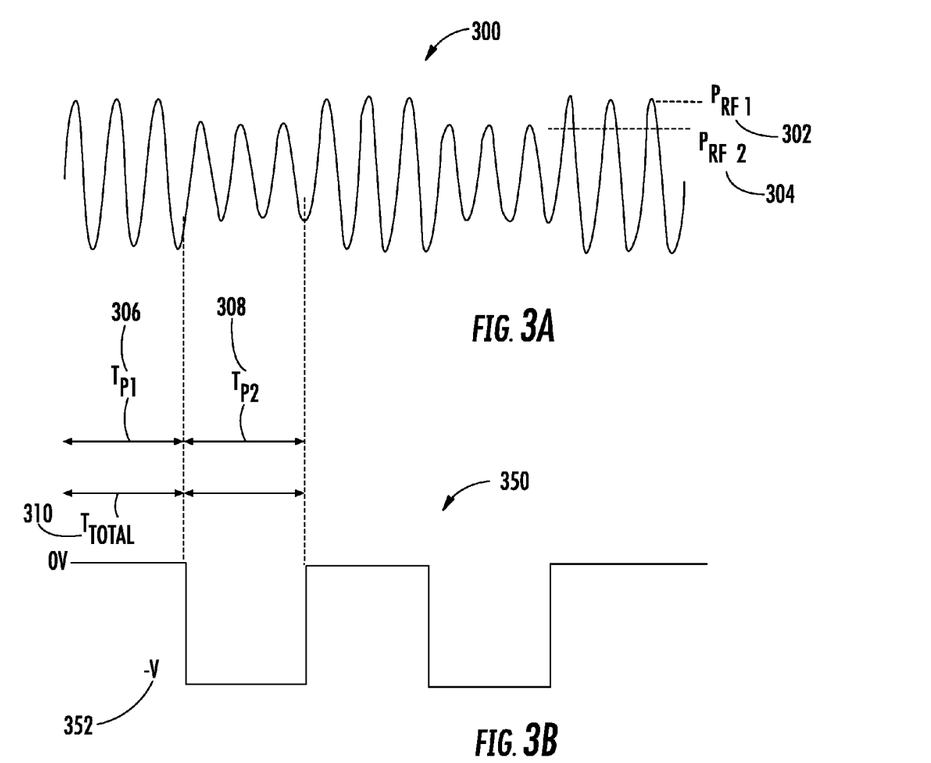
FIG. 3A illustrates a RF power waveform generated by the RF source according to the present invention that has multiple amplitudes for at least partially neutralizing charge accumulation on the substrate.
FIG. 3B illustrates a bias voltage waveform generated by the bias voltage supply according to the present invention that applies a negative voltage to the substrate during plasma processing to attract ions.

FIG. 3A illustrates a RF power waveform 300 generated by the RF source 130 (FIG. 1) according to the present invention that has multiple amplitudes for at least partially neutralizing charge accumulation on the substrate 146 (FIG. 1). The waveform 300 is pulsed and has a first 302 and a second power level 304, which are indicated in the figure as $P_{RF1}$ and $P_{RF2}$, respectively. However, it should be understood that waveforms with more than two amplitudes can be used in the methods of the present invention to at least partially neutralize charge accumulation on the substrate 146. It should also be understood that the waveforms may or may not have discrete amplitudes. For example, the waveforms can be continuously changing. That is, in some embodiments, the waveforms can ramp with positive or negative slopes. Also, the waveforms can ramp in a linear or in a non-linear rate.

The first power level $P_{RF1}$ 302 is chosen to provide enough RF power to at least partially neutralize charge accumulation on the substrate 146 when the substrate 146 is not biased for plasma processing. The second power level $P_{RF2}$ 304 is chosen to be suitable for plasma processing, such as plasma doping, plasma etching, and plasma deposition. In various embodiments, the waveform 300 generated by the RF source 130 including the first and second power levels $P_{RF1}$ 302, $P_{RF2}$ 304 is applied to one or both of the planar coil RF antenna 126 and the helical coil RF antenna 128 (see FIG. 1). In one specific embodiment, the waveform 300 generated by the RF source 130 is applied to one of the planar coil RF antenna 126 and the helical coil RF antenna 128 when it is at the first power level $P_{RF1}$ 302 and is applied to the other of the planar coil RF antenna 126 and the helical coil RF antenna 128 when it is at the second power levels $P_{RF2}$ 304. In another specific embodiment, the waveform 300 generated by the RF source 130 is applied to one of the planar RF antenna 126 and the helical coil RF antenna 128 when it has a first frequency and is applied to the other of the planar coil RF antenna 126 and the helical coil RF antenna 128 when it has a second frequency that is different from the first frequency as described in connection with FIGS. 5A-5C.

The waveform 300 shown in FIG. 3A indicates that the first power level $P_{RF1}$ 302 is greater than the second power level $P_{RF2}$ 304. However, in other embodiments, the first power level $P_{RF1}$ 302 is less than the second power level $P_{RF2}$ 304. Also, in some embodiments, the waveform 300 includes a third power level that is zero or some relatively low power level when the substrate 146 is not biased for plasma processing as described in connection with FIG. 6.

The waveform 300 also indicates a first pulse period $T_{P1}$ 306 corresponding to the time period were the waveform 300 has a power equal to the first power level $P_{RF1}$ 302 and a second pulse period $T_{P2}$ 308 corresponding to the time period were the waveform has a power equal to the second power level $P_{RF2}$ 304. The total multi-amplitude pulse period for the waveform 300 $T_{Total}$ 310 is the combination of the first pulse period $T_{P1}$ 306 and the second pulse period $T_{P2}$ 308. For example, in one embodiment, the first and second pulse periods $T_{P1}$ 306, $T_{P2}$ 308 are both in the range of 30-500 µs and the total pulse period $T_{Total}$ 310 is in the range of 60 µs-1 ms. In other embodiments, the total pulse period $T_{Total}$ 310 can be on order of 1 ms or greater.

FIG. 3A indicates that the frequency of the waveform 300 during the first pulse period $T_{P1}$ 306 is the same as the frequency of the waveform 300 during the second pulse period $T_{P2}$ 308. However, it should be understood that in various embodiments, the frequency of the waveform 300 during the first pulse period $T_{P1}$ 306 can be different from the frequency of the waveform 300 during the second pulse period $T_{P2}$ 308 as described in connection with FIGS. 5A-5C. In addition, the frequency of the waveform 300 can be changed within at least one of the first and the second pulse periods $T_{P1}$, 306, $T_{P2}$, 308.

Thus, in some embodiments, the waveform 300 includes both multiple frequencies and multiple amplitudes that are chosen to at least partially neutralize charge accumulation during plasma processing. In addition, in some embodiments, the waveform 300 includes both multiple frequencies and multiple amplitudes that are chosen to improve certain process parameters, such as the retained dose for plasma doping. Furthermore, in some embodiments, the waveform 300 includes both multiple frequencies and multiple amplitudes that are chosen to assist in achieving certain process goals. For example, the waveform 300 can include both multiple frequencies and multiple amplitudes to improve process control and to increase process rates.

Also, the waveform 300 can include both multiple frequencies and multiple amplitudes to achieve knock-on ion implants to form retrograde doping profiles. Also, the waveform 300 can include both multiple frequencies and multiple amplitudes to achieve certain etching profiles and etching process goals, such as achieving high aspect-ratio etching profiles. In addition, the waveform 300 can include both multiple frequencies and multiple amplitudes to achieve certain deposition profiles and process goals, such as depositing material into high aspect-ratio structures, depositing conformal or near conformal coating, and filling gaps in trenches and other device structures.

FIG. 3B illustrates a bias voltage waveform 350 generated by the bias voltage supply 148 (FIG. 1) according to the present invention that applies a negative voltage 352 to the substrate 146 during plasma processing to attract ions. The bias voltage waveform 350 is synchronized with the RF power waveform 300. However, it should be understood that the pulses in the bias voltage waveform 350 are not necessarily aligned with the pulses in the RF power waveform 300. The negative voltage 352 is applied during the second pulse period $T_{P2}$ 308 when the waveform 350 generated by the RF source 130 has a power equal to the second power level $P_{RF2}$ 304. The waveform 350 is at wound potential during the first pulse period $T_{P1}$ 306 when the plasma processing is terminated and the waveform 300 has a power equal to the first power level $P_{RF1}$ 302.

Applying a waveform to the plasma source 101 (FIG. 1) with two different power levels where the first power level $P_{RF1}$ 302 is applied by the RF source 130 during the period $T_{P1}$ 306 when the waveform 350 generated by the bias voltage supply 148 (FIG. 1) is at ground potential will assist in neutralizing charge accumulated on the substrate 146 (FIG. 1). Electrons in the corresponding plasma will neutralize at least some of the charge accumulated on the substrate 146.

Figure 3C:
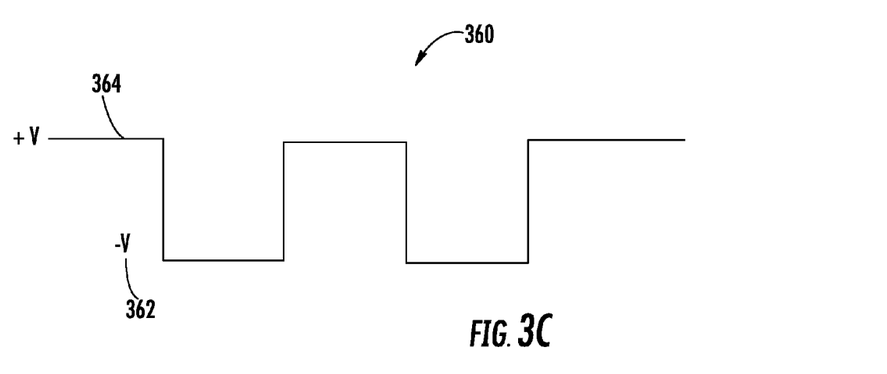
FIG. 3C illustrates a bias voltage waveform generated by the bias voltage supply according to the present invention that applies a negative voltage to the substrate during plasma processing to attract ions and that applies a positive voltage to the substrate after plasma processing is terminated to assist in neutralizing charge on the substrate.

FIG. 3C illustrates a waveform 360 generated by the bias voltage supply 148 (FIG. 1) according to the present invention that applies a negative voltage 362 to the substrate 146 during plasma processing to attract ions and that applies a positive voltage 364 to the substrate 146 after plasma processing is terminated to assist in neutralizing charge on the substrate 146. The negative voltage 362 is applied during the second pulse period $T_{P2}$ 308 when the waveform 300 generated by the RF source 130 has a power equal to the second power level $P_{RF2}$ 304. The waveform 360 is at a positive potential 364 during the first pulse period $T_{P1}$ 306 when the waveform 300 generated by the RF source 130 has a power equal to the first power level $P_{RF1}$ 302.

Applying a waveform to the plasma source 101 (FIG. 1) with two different power levels where the first power level $P_{RF1}$ 302 is applied by the RF source 130 (FIG. 1) during the first period $T_{P1}$ 306 when the waveform 360 generated by the bias voltage supply 148 (FIG. 1) is at a positive potential 364 will assist in neutralizing charge accumulated on the substrate 146 (FIG. 1). Electrons in the corresponding plasma will neutralize at least some the charge accumulated on the substrate 146. In addition, the positive voltage 364 applied the substrate 146 will also neutralize at least some of the charge accumulated on the substrate 146.

Figure 4A:
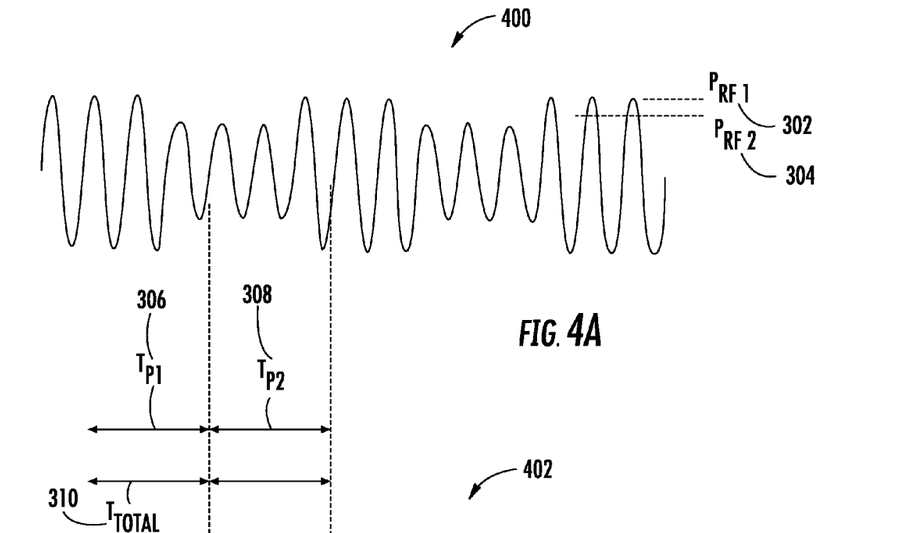
FIGS. 4A-C illustrate a RF power waveform generated by the RF source and bias voltage waveforms generated by the bias voltage supply according to the present invention that are similar to the waveforms described in connection with FIGS. 3A-3C, but that are displaced in time so as to perform plasma processing with both the first and the second power level $P_{RF1}$, $P_{RF2}$.
Figure 4B:
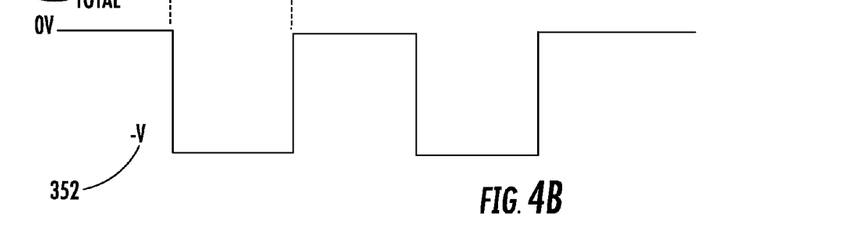
Figure 4C:
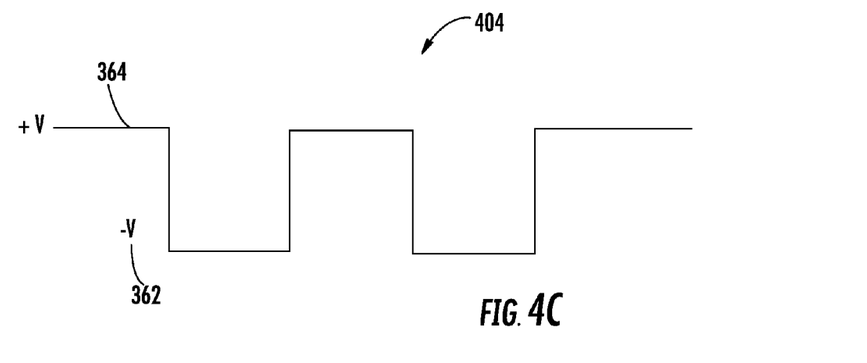

FIGS. 4A-C illustrate a RF power waveform 400 generated by the RF source 130 (FIG. 1) and bias voltage waveforms 402, 404 generated by the bias voltage supply 148 (FIG. 1) according to the present invention that are similar to the waveforms 300, 350, and 360 described in connection with FIGS. 3A-3C, but that are displaced in time relative to the waveforms 300, 350, and 360 so as to perform plasma process with both the first and the second power levels $P_{RF1}$ 302, $P_{RF2}$ 304. In this embodiment, the RF power waveform 400 and the bias voltage waveforms 402, 404 are synchronized, but the pulses in the RF power waveform 400 are not aligned with the pulses in the bias voltage waveforms 402, 404.

Changing the power generated by the RF source 130 during plasma processing allows the user to more precisely control the amount of charge that is accumulating on the surface of the substrate 146 during plasma processing to achieve certain process goals and effects. For example, increasing the power near the end of the second pulse period $T_{P2}$ 308 will enhance the neutralization of charge accumulated on the substrate 146.

Figure 5A:
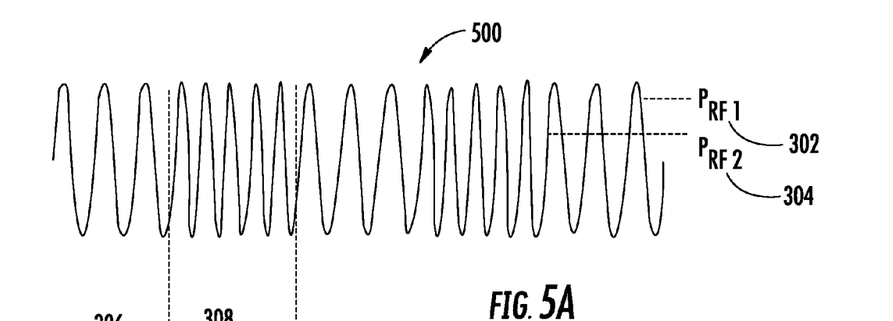
FIGS. 5A-C illustrate a RF power waveform generated by the RF source with a variable frequency and corresponding bias voltage waveforms generated by the bias voltage supply according to another embodiment of the present invention.
Figure 5B:
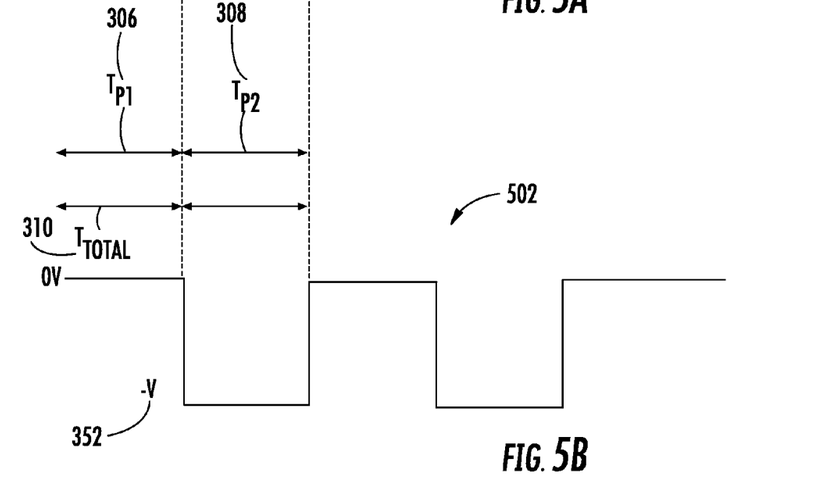
Figure 5C:
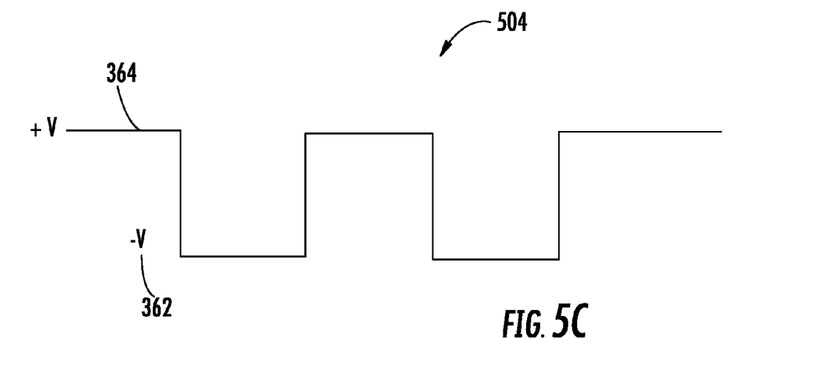

FIGS. 5A-C illustrates a RF power waveform 500 generated by the RF source 130 (FIG. 1) with a variable frequency and corresponding bias voltage waveforms 502, 504 generated by the bias voltage supply 148 (FIG. 1) according to another embodiment of the present invention. The waveform 500 is similar to the waveforms 300, 400 described in connection with FIGS. 3 and 4. However, the RF powers in the first and second pulse periods $T_{P1}$ 306, $T_{P2}$ 308 are the same and the frequencies in the first and second pulse periods $T_{P1}$ 306, $T_{P2}$ 308 are different. Changing the frequency of the waveform 500 changes the ion/electron density and, therefore, changes the charge neutralization efficiency.

Thus, in one embodiment, the frequency of the waveform 500 in the first pulse period $T_{P1}$ 306 is different from the frequency of the waveform 500 in the second pulse period $T_{P2}$ 308 and these frequencies are chosen to at least partially neutralize charge accumulation during plasma processing. The waveforms 502, 504 are similar to the waveforms 350 and 360 that were described in connection with FIG. 3. In other embodiments, the waveforms 502, 504 are displaced in time relative to the waveform 500, similar to the displacement of waveforms 402, 404 that were described in connection with FIG. 4.

In addition, in one aspect of the present invention, parameters, such as the multiple power levels generated by the RF source 130, the frequency of the waveform 500 in the first and second pulse periods $T_{P1}$ 306, $T_{P2}$ 308, and the relative timing of the waveform 500 with respect to the waveforms generated by the bias voltage supply 148 (FIG. 1), are chosen to achieve certain process goals. For example, generating multiple power levels with the RF source 130 where one power level is generated by the RF source 130 when the bias voltage is at ground potential allows the user to use less power during plasma processing and/or to reduce process times because some plasma processing will occur when the bias voltage is at ground potential.

Also, in one embodiment of the present invention, at least one of the multiple power levels generated by the RF source 130 (FIG. 1), the frequency of the waveform 500 in at least one of the first and second pulse periods $T_{P1}$ 306, $T_{P2}$ 308, and the relative timing of the waveform 500 with respect to the waveforms generated by the bias voltage supply 148 (FIG. 1) are chosen to improve the retained dose on the substrate 146 (FIG. 1) when performing plasma doping. For example, using less power during plasma processing will result in less deposition and, therefore, a higher retained dose in the substrate. The operating pressure, gas flow rates, type of dilution gas, and plasma source power can also be selected to further improve the retained dose with this method.

Also, in another embodiment of the present invention, at least one of the multiple power levels generated by the RF source 130 (FIG. 1), the frequency of the waveform 500 in at least one of the first and second pulse periods $T_{P1}$ 306, $T_{P2}$ 308, and the relative timing of the waveform 500 with respect to the waveforms generated by the bias voltage supply 148 are chosen to improve sidewall coverage during plasma processing. The term "improve sidewall coverage" is referred to herein as increasing the ratio of the deposition rate of material on the sidewall to the deposition rate of material on the surface of the surface of the substrate perpendicular to the ion flux. Achieving better sidewall coverage is important for many applications, such as conformal doping and conformal deposition applications. For example, many three-dimensional and other state-of-the-art devices required conformal doping and conformal deposition.

Also, in another embodiment of the present invention, waveforms are generated by the RF source 130 (FIG. 1) with certain multiple power levels, multiple frequencies, and relative timings with respect to the waveforms generated by the bias voltage supply 148 (FIG. 1) so as to create knock-on ion implants for plasma doping. The term "knock-on ion implant" is defined herein as a recoil ion implant where an ion is implanted through the surface layers of the substrate 146 to drive the dopant material into the substrate 146.

The ions used for the knock-on ion implant can be an inert ion species, such as He, Ne, Ar, Kr and Xe, which can be formed from an inert feed gas. In some embodiments, the mass of the knock-on ions is chosen to be similar to a mass of the desired dopant ions. The RF source 130 (FIG. 1) generates a RF power that is sufficient to direct the knock-on ions toward the substrate 146 (FIG. 1) with enough energy to physically knock the deposited dopant material into both the planar and non-planar features of the substrate 146 (FIG. 1) upon impact. Also, the operating parameters, such as chamber pressure, gas flow rate, plasma source power, gas dilution, and duty cycle of pulsed bias supply, can be chosen to enhance knock-on ion implants.

Knock-on ion implant can be used to form retrograde doping profiles. The waveforms are generated by the RF source 130 (FIG. 1) with certain multiple power levels, multiple frequencies, and relative timings with respect to the waveforms generated by the bias voltage supply 148 so as to create a retrograde profile, such as a retrograde doping profile or a retrograde deposited film profile. The term "retrograde profile" is defined herein as a profile where the peak concentration of the profile is below the surface of the substrate. See, for example, U.S. patent application Ser. No. 12/044,619, entitled "A Method of Forming a Retrograde Material Profile Using Ion Implantation, which is assigned the present assignee. The entire specification of U.S. patent application Ser. No. 12/044,619 is incorporated herein by reference.

For plasma doping, it is sometimes desirable to form retrograde ion implant dopant profiles because it is difficult to precisely control the depth of ion implanted layers for many reasons. For example, during plasma doping, there could be some unintentional etching of the surface of the substrate caused by physical sputtering and chemical etching. In addition, there could be some unintentional deposition on the surface of the substrate. Furthermore, there can be a significant ion implant energy distribution due to many factors, such as the presence of multiple ion species, collisions between ions, non uniformities in the plasma sheath, presence of secondary electron emissions, displacements currents formed due to parasitic impedances, and the application of non-ideal bias pulses.

In addition, it is sometimes desirable to form retrograde ion implant dopant profiles because surface-peak dopant profiles are very sensitive to post deposition or post implant processes since most of the maximum peak concentration of deposited or implanted material is located at or near the surface of the substrate. In particular, the photo-resist strip process typically performed after implantation will remove a significant amount of dopant material near the surface.

In other embodiments, the waveforms are generated by the RF source 130 with certain multiple power levels, multiple frequencies, and relative timings with respect to the waveforms generated by the bias voltage supply 148 so as to achieve certain process goals or process profiles, such as etching profiles. For example, the multiple power levels, multiple frequencies, and relative timings with respect to the waveforms generated by the bias voltage supply 148 can be chosen to achieve high aspect-ratio etching profiles or certain types of deposition profiles.

One skilled in the art will appreciate that waveforms generated by the RF source 130 (FIG. 1) according to the present invention can have both multiple amplitudes and multiple frequencies and can have various relative timings with respect to the waveforms generated by the bias voltage supply 148 (FIG. 1). In fact, there are an almost infinite number of possible waveforms with multiple power levels and multiple frequencies that can be generated by the RF source 130 (FIG. 1) and relative timing with respect to the waveforms generated by the bias voltage supply 148 (FIG. 1) that will at least partially neutralize charge and/or achieve the process goals described herein.

Figure 6:
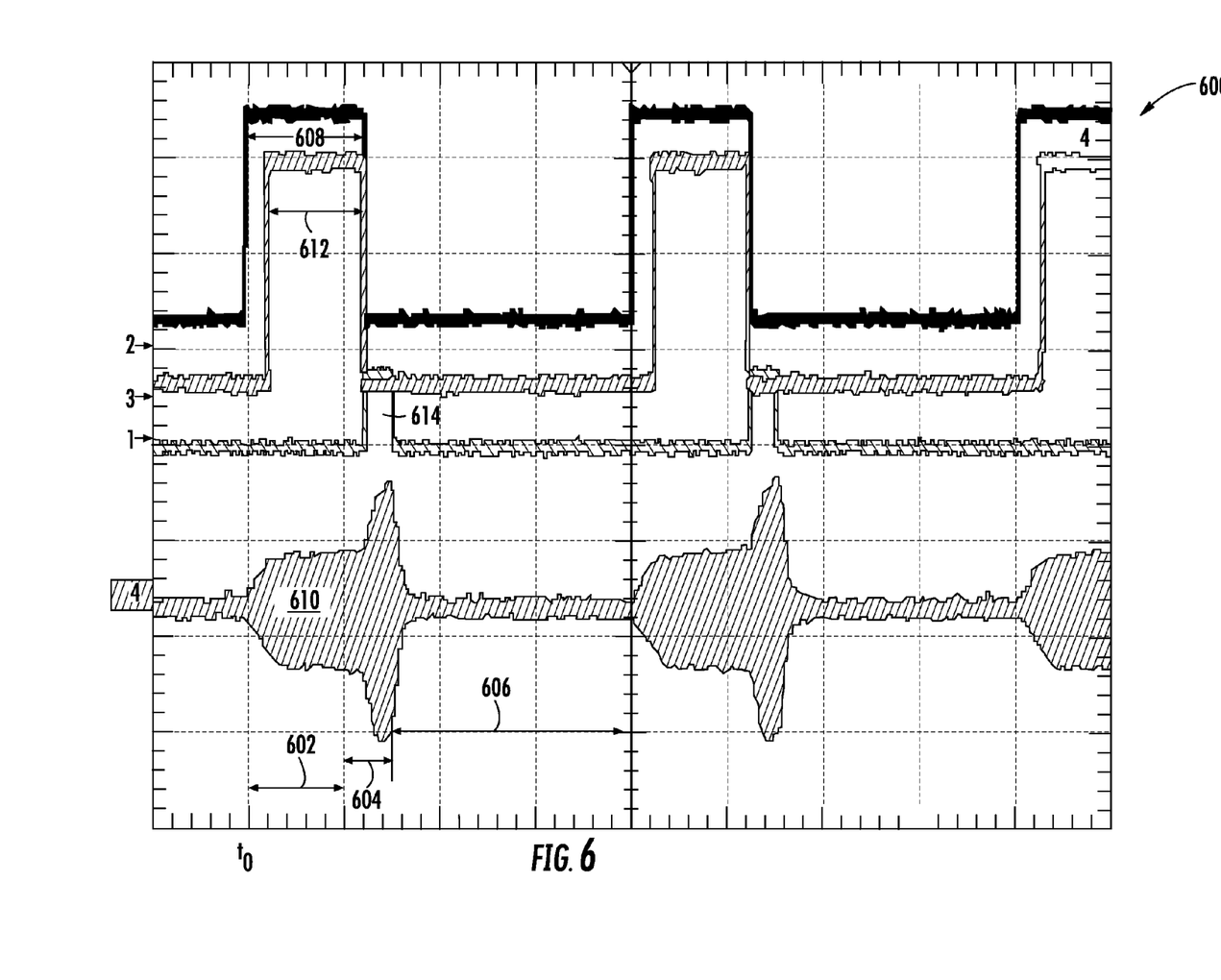
FIG. 6 illustrates measured multi-set-point RF power and control signal waveforms according to one embodiments of the present invention.

FIG. 6 illustrates measured multi-set-point RF power and control signal waveforms 600 according to one embodiment of the present invention. The waveforms 600 include RF power and control signal waveforms as a function of time beginning at time $t_0$. The waveforms 600 show an ion implantation period 602, a charge neutralization period 604, and a power off period 606.

Referring to FIGS. 1 and 6, at time $t_0$, the controller 152 (FIG. 1) generates an implant pulse 608 that instructs the bias voltage power supply 148 (FIG. 1) to bias the substrate 146 (FIG. 1) with a negative voltage pulse that attracts ions in the plasma towards the substrate 146. The rise time of the implant pulse 602 is about 30 microseconds. Also, at time $t_0$ the controller 152 generates a RF pulse control signal that initiates a RF power waveform 610 having a first power level. In the ion implantation period 602, the controller 152 generates a first RF pulse control signal 612 that causes RF currents to flow in at least one of the RF antennas 126 and 128 (FIG. 1) thereby striking a plasma. The rise time of the first RF pulse control signal 612 is about 30 microseconds.

The charge neutralization period 604 begins when the first RF pulse control signal 612 and the implant pulse signal 608 both return to zero. The fall time of the first RF pulse control signal and the implant pulse control signal is about 20 microseconds. In the charge neutralization period 604, the controller 152 generates a second RF pulse control signal 614 that ramps the RF power waveform 610 to a second power level. In many embodiments, the second power level is greater than the first power level as shown in FIG. 6. However, in other embodiments, the second power level can be any power level including a power level that is lower than the first power level. The rise time of the second RF pulse control signal is also about 30 microseconds. In the charge neutralization period 604, at least some of the charge on the substrate 146 is efficiently neutralized by electrons in the plasma. This partial or complete charge neutralization reduces undesirable charging effects on the substrate 146.

The power off period 606 begins when the second RF pulse control signal 614 returns to zero. The fall time of the second RF pulse control signal 614 is about 20 microseconds. In the power off period 606, the RF power is extinguished, which terminates the plasma. The methods of plasma processing with enhanced charge neutralization according to the present invention can be employed with many different multi-set-point RF power and control signal waveforms 600.

It should be understood that the methods for charge neutralization according to the present invention can be used with numerous other types of plasma processing apparatus. For example, the methods for charge neutralization can be used with plasma processing apparatus that have inductively coupled plasma (ICP) sources, helicon resonator plasma sources, microwave plasma sources, ECR plasma source, and capacitive coupled plasma sources. In fact, any type of plasma source that can be operated in a pulsed mode can be used to perform the methods of the present invention.

EQUIVALENTS

While the present teachings are described in conjunction with various embodiments and examples, it is not intended that the present teachings be limited to such embodiments. On the contrary, the present teachings encompass various alternatives, modifications and equivalents, as will be appreciated by those of skill in the art, may be made therein without departing from the spirit and scope of the invention.

What is claimed is:

1. A method of plasma processing a substrate, the method comprising:
   providing the substrate proximate a plasma source;
   applying to the plasma source a first RF power level during a first period and a second RF power level during a second period, the first and second RF power levels being greater than zero RF power level, wherein the second RF power level is greater than the first RF power level;
   generating with the plasma source a first plasma during the first period and a second plasma during the second period;
   applying to the substrate a first bias voltage during the first period and a second bias voltage during the second period, wherein the first bias voltage has more negative potential than the second bias voltage; and
   applying to the plasma source a third RF power level during a third period, wherein the third RF power level is less than the first RF power level; and
   applying to the substrate the second bias voltage during the third period.

2. The method according to claim 1, the method further comprising:
   striking the plasma to generate the first plasma during the first period.

3. The method according to claim 1, further comprising:
   etching the substrate during at least one of the first and second periods.

4. The method according to claim 1, further comprising:
   depositing a material during at least one of the first and second periods.

5. The method according to claim 1, wherein at least one of the first and the second power levels are substantially constant during respective ones of the first and the second periods.

6. The method according to claim 1, further comprising:
   directing ions from in the first plasma toward the substrate during the first period; and
   directing electrons from the second plasma toward the substrate during the second period.

7. The method according to claim 1, wherein the plasma source comprises:
   at least one of a planar coil RF antenna and a helical coil RF antenna; and
   a RF power supply electrically coupled to at least one of the planar coil RF antenna and the helical coil RF antenna.

8. The method according to claim 1, wherein the plasma source comprises:
   at least one of a planar coil RF antenna and a helical coil RF antenna; and
   a RF power supply electrically coupled to one of the planar coil RF antenna and the helical coil RF antenna, the other one of the planar coil RF antenna and the helical coil RF antenna being a parasitic antenna.

9. The method according to claim 1, wherein the plasma source comprises:
   a planar coil RF antenna and a helical coil RF antenna; and
   a RF power supply electrically coupled to the planar coil RF antenna and the helical coil RF antenna.

10. The method according to claim 9, further comprising:
    applying the first RF power level to the one of the planar coil RF antenna and the helical coil RF antenna of the plasma source during the first period; and
    applying the second RF power level to the other one of the planar coil RF antenna and the helical coil RF antenna of the plasma source during the second period.

11. The method according to claim 1, wherein the second period immediately follows the first period.

12. The method according to claim 1, wherein the first bias voltage is negative bias voltage and the second bias voltage is ground bias voltage.

13. The method according to claim 1, wherein the first bias voltage is negative bias voltage and the second bias voltage is positive bias voltage.

14. A method of plasma processing a substrate, the method comprising:
    applying to a plasma source a first power level during a first period and generating a first plasma containing first ions;
    applying to the plasma source a second power level during a second period and generating a second plasma containing second ions, the second power level being greater than the first power level;
    applying to the plasma source a third power level during a third period, the third power level being less than the first power level;
    applying to the substrate a second bias voltage during the third period
    directing, during the first period, the first ions from the first plasma toward the substrate and accumulating charges in the substrate; and
    decreasing, during the second period, the charge accumulated in the substrate.

15. The method according to claim 14, the method further comprising:
    striking the plasma to generate the first plasma during the first period while applying to the plasma source the first power level.

16. The method according to claim 14, the method further comprising:
    etching the substrate during the first period.

17. The method according to claim 14, the method further comprising:
    depositing a material during the first period.

18. The method according to 14, the method further comprising:
    implanting ions from the plasma into the substrate during the first period.

19. The method according to claim 14, wherein the plasma source comprises:
    a planar coil RF antenna and a helical coil RF antenna; and
    a RF power supply electrically coupled to the planar coil RF antenna and the helical coil RF antenna.

20. The method according to claim 19, further comprising:
    applying the first power level to the one of the planar coil RF antenna and the helical coil RF antenna of the plasma source during the first period; and
    applying the second power level to the other one of the planar coil RF antenna and the helical coil RF antenna of the plasma source during the second period.

* * * * *